US012751270B2

(12) United States Patent
Kuo et al.

(10) Patent No.: US 12,751,270 B2
(45) Date of Patent: Sep. 29, 2026

(54) DIFFUSION BARRIER FOR SEMICONDUCTOR DEVICE AND METHOD

(71) Applicant: Taiwan Semiconductor Manufacturing Co., Ltd., Hsinchu (TW)

(72) Inventors: Chia-Pang Kuo, Taoyuan City (TW); Huan-Yu Shih, Taipei (TW); Wen-Hsuan Chen, Hsinchu (TW); Cheng-Lun Tsai, Hsinchu (TW); Ya-Lien Lee, Baoshan Township (TW); Cheng-Hui Weng, Hsinchu (TW); Chun-Chieh Lin, Taichung City (TW); Hung-Wen Su, Jhubei City (TW); Yao-Min Liu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 43 days.

(21) Appl. No.: 17/815,026

(22) Filed: Jul. 26, 2022

(65) Prior Publication Data

US 2022/0367376 A1 Nov. 17, 2022

Related U.S. Application Data

(62) Division of application No. 16/899,055, filed on Jun. 11, 2020, now Pat. No. 11,676,898.

(51) Int. Cl.

| | |
|---|---|
| ***H10W 20/41*** | (2026.01) |
| ***H10P 14/20*** | (2026.01) |

(Continued)

(52) U.S. Cl.

CPC ........... *H10W 20/425* (2026.01); *H10P 14/24* (2026.01); *H10P 14/3216* (2026.01);

(Continued)

(58) Field of Classification Search

CPC ......... H01L 2924/00; H01L 2924/0002; H01L 27/11582; H01L 23/53295; H01L 21/7682;

(Continued)

(56) References Cited

U.S. PATENT DOCUMENTS 10,629,484 B1 * 4/2020 Parikh ............... H01L 21/76897
10,651,292 B2 5/2020 Cheng et al.

(Continued)

FOREIGN PATENT DOCUMENTS

CN 110970355 A 4/2020
DE 102005023122 A1 11/2006

(Continued)

OTHER PUBLICATIONS

DE10201831694 [machine's translation][specification] (Year: 2018).*

(Continued)

*Primary Examiner* — Tony Tran
(74) *Attorney, Agent, or Firm* — Slater Matsil, LLP

(57) ABSTRACT

A method includes forming an insulating layer over a conductive feature; etching the insulating layer to expose a first surface of the conductive feature; covering the first surface of the conductive feature with a sacrificial material, wherein the sidewalls of the insulating layer are free of the sacrificial material; covering the sidewalls of the insulating layer with a barrier material, wherein the first surface of the conductive feature is free of the barrier material, wherein the barrier material includes tantalum nitride (TaN) doped with a transition metal; removing the sacrificial material; and covering the barrier material and the first surface of the conductive feature with a conductive material.

18 Claims, 11 Drawing Sheets

(51) Int. Cl.
*H10P 14/24* (2026.01)
*H10W 20/00* (2026.01)
*H10W 20/42* (2026.01)

(52) U.S. Cl.
CPC ....... *H10W 20/033* (2026.01); *H10W 20/076* (2026.01); *H10W 20/42* (2026.01); *H10W 20/435* (2026.01)

(58) Field of Classification Search
CPC ........... H01L 27/11556; H01L 27/1157; H01L 27/11565
See application file for complete search history.

(56) References Cited

U.S. PATENT DOCUMENTS

| | | | |
|---|---|---|---|
| 11,024,801 | B2 | 6/2021 | Wu et al. |
| 2002/0137332 | A1 | 9/2002 | Paranjpe et al. |
| 2004/0175926 | A1 | 9/2004 | Wang et al. |
| 2004/0197958 | A1 | 10/2004 | Xia et al. |
| 2006/0267205 | A1* | 11/2006 | Koerner ............ H01L 23/53238 257/762 |
| 2009/0075470 | A1 | 3/2009 | Nitta et al. |
| 2013/0140698 | A1 | 6/2013 | Lakshmanan et al. |
| 2014/0220772 | A1 | 8/2014 | Lakshmanan et al. |
| 2015/0255340 | A1 | 9/2015 | Duong et al. |
| 2015/0294863 | A1 | 10/2015 | Nemani et al. |
| 2019/0148153 | A1* | 5/2019 | Cheng ............... H01L 21/28568 257/751 |
| 2019/0341304 | A1 | 11/2019 | Ganguli et al. |
| 2020/0066645 | A1* | 2/2020 | Farmer ............. H01L 21/76843 |
| 2020/0105592 | A1 | 4/2020 | Kuo et al. |
| 2020/0216949 | A1 | 7/2020 | Bhuyan et al. |

FOREIGN PATENT DOCUMENTS

| | | | |
|---|---|---|---|
| DE | 102018131694 | A1 | 4/2020 |
| KR | 20050106504 | A | 11/2005 |
| KR | 20180015124 | A | 2/2018 |
| KR | 20190050776 | A | 5/2019 |
| KR | 20190099990 | A | 8/2019 |
| KR | 20200001556 | A | 1/2020 |
| KR | 20200043531 | A | 4/2020 |
| KR | 1020200037053 | A | 4/2020 |
| WO | 2016195672 | A1 | 12/2016 |

OTHER PUBLICATIONS

DE10201831694 [Drawing] (Year: 2018).*
Hosseini, Maryamsadat, et al., "Amorphous CoTix as a liner/diffusion barrier material for advanced copper metallization," Journal of Alloys and Compounds, vol. 721, Jun. 1, 2017, pp. 134-142.
Kim, Sung-Wook et al., "Improvement of Copper Diffusion Barrier Properties of Tantalum Nitride Films by Incorporating Ruthenium Using PEALD," Journal of the Electrohemical Society, ECS The Electrochemical Society, Sep. 22, 2008, pp. H885-H888.

* cited by examiner

DIFFUSION BARRIER FOR SEMICONDUCTOR DEVICE AND METHOD

PRIORITY CLAIM AND CROSS-REFERENCE

This application is a divisional of U.S. patent application Ser. No. 16/899,055, entitled "Diffusion Barrier for Semiconductor Device and Method," filed on Jun. 11, 2020, which application is incorporated herein by reference.

BACKGROUND

Integrated circuits include interconnect structures, which comprise metal lines and vias to serve as three-dimensional wiring structures. The function of the interconnect structures is to properly connect densely packed devices together.

Metal lines and vias are formed in the interconnect structure. Metal lines and vias are typically formed by damascene processes, in which trenches and via openings are formed in dielectric layers. A barrier layer is then deposited, followed by the filling of the trenches and via openings with copper. After a Chemical Mechanical Polish (CMP) process, the top surfaces of the metal lines are leveled, leaving metal lines and vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
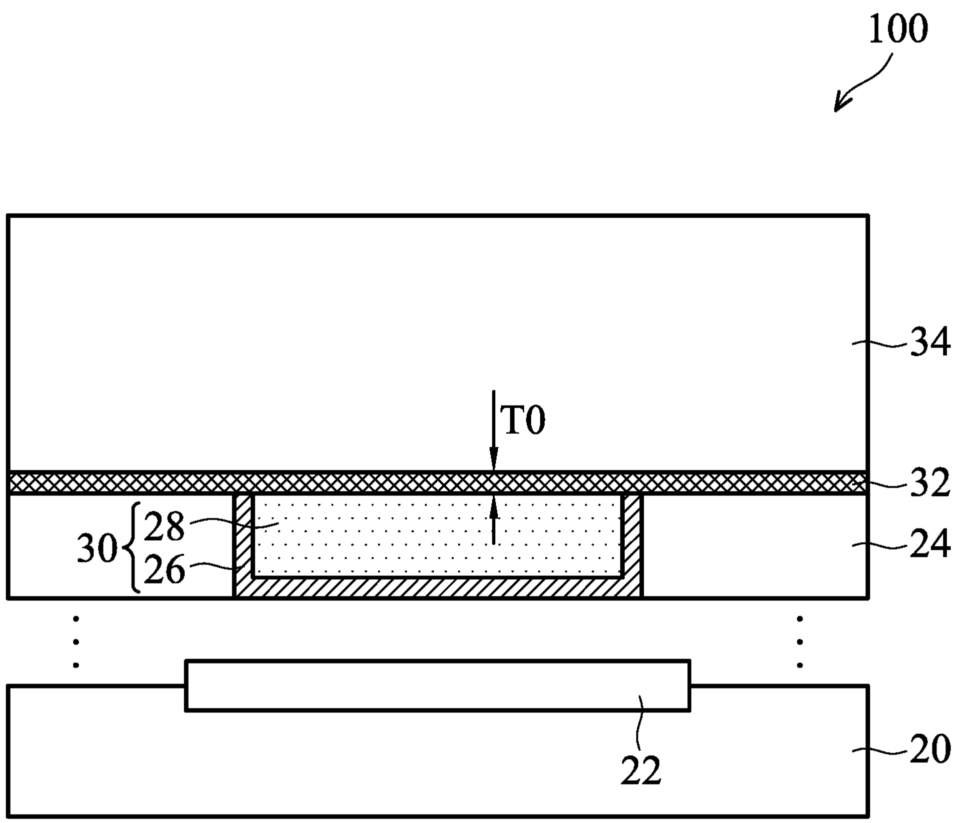
FIGS. 1, 2, 3, and 4 illustrate cross-sectional views of intermediate stages in the formation of a metal line and a via, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of selectively forming a barrier layer for a conductive feature is provided in accordance with various embodiments. The intermediate stages in the formation of the conductive feature are illustrated in accordance with some embodiments. Some variations of some embodiments are discussed. Throughout the various views and illustrative embodiments, like reference numbers are used to designate like elements. In accordance with some embodiments of the present disclosure, the formation of the conductive feature includes selectively forming a barrier layer over a conductive region in an opening, filling the opening with a metallic material, and performing a planarization. The selective formation of the conductive barrier layer is achieved through forming a sacrificial layer on an underlying metal feature. The sacrificial layer resists adhesion of the barrier layer material such that the barrier layer is selectively grown on the sidewalls of the via opening, with little or no barrier layer being formed on the sacrificial layer. The barrier layer is formed having a dopant metal incorporated into the barrier layer (e.g., as a dopant or as a sublayer of the barrier layer) to increase the density of the barrier layer. After the barrier layer is formed, a treatment is performed to remove the sacrificial layer. The remaining opening is then filled with a metallic material such as copper, which is formed on the metal feature.

FIG. 1 illustrates a cross-sectional view of a package component 100, in accordance with some embodiments of the present disclosure. The package component 100 may be a device wafer (such as a logic device wafer) including active devices such as transistors and/or diodes, and may include passive devices such as capacitors, inductors, resistors, or the like. In accordance with alternative embodiments of the present disclosure, the package component 100 is an interposer wafer, which may or may not include active devices and/or passive devices. In accordance with yet alternative embodiments of the present disclosure, the package component 100 is a package substrate strip, which may include package substrates with cores therein or core-less package substrates. In subsequent discussion, a device wafer is used as an example of the package component 100. The teaching of the present disclosure may also be applied to interposer wafers, package substrates, packages, etc.

In accordance with some embodiments of the present disclosure, the package component 100 includes a semiconductor substrate 20 and features formed at a top surface of the semiconductor substrate 20. The semiconductor substrate 20 may comprise crystalline silicon, crystalline germanium, silicon germanium, a III-V compound semiconductor such as GaAsP, AlInAs, AlGaAs, GaInAs, GaInP, GaInAsP, the like, or combinations thereof. The semiconductor substrate 20 may also be a bulk silicon substrate or a Silicon-On-Insulator (SOI) substrate, in some embodiments. Shallow Trench Isolation (STI) regions (not shown) may be formed in the semiconductor substrate 20 to isolate the active regions in the semiconductor substrate 20. Although not shown, through-vias may be formed extending into the semiconductor substrate 20 to electrically interconnect features on opposite sides of the package component 100.

In accordance with some embodiments of the present disclosure, the package component 100 is used to form a device die. In these embodiments, integrated circuit devices 22 are formed on a top surface of the semiconductor substrate 20. Example integrated circuit devices 22 include Complementary Metal-Oxide Semiconductor (CMOS) transistors, resistors, capacitors, diodes, or the like. The details of the integrated circuit devices 22 are not illustrated herein. In accordance with alternative embodiments, the package component 100 is used for forming interposers. In accordance with these embodiments, the substrate 20 may also be, for example, a dielectric substrate.

Further illustrated in FIG. 1 is a dielectric layer 24. The dielectric layer 24 may be, for example, an Inter-Layer Dielectric (ILD) or an Inter-Metal Dielectric (IMD). In accordance with some embodiments of the present disclosure, the dielectric layer 24 is an ILD, in which contact plugs are formed. The corresponding dielectric layer 24 may be formed of Phospho Silicate Glass (PSG), Boro Silicate Glass (BSG), Boron-Doped Phospho Silicate Glass (BPSG), Fluorine-Doped Silicate Glass (FSG), a silicon oxide layer (formed using Tetra Ethyl Ortho Silicate (TEOS)), the like, or combinations thereof. The dielectric layer 24 may be formed using spin-on coating, Atomic Layer deposition (ALD), Flowable Chemical Vapor Deposition (FCVD), Chemical Vapor Deposition (CVD), Plasma-Enhanced Chemical Vapor Deposition (PECVD), Low-Pressure Chemical Vapor Deposition (LPCVD), or the like. In accordance with some embodiments of the present disclosure, the dielectric layer 24 is an IMD, in which metal lines and/or vias are formed. The corresponding dielectric layer 24 may be formed of a carbon-containing low-k dielectric material, Hydrogen SilsesQuioxane (HSQ), MethylSilsesQuioxane (MSQ), another low-k dielectric material, the like, or combinations thereof. In accordance with some embodiments of the present disclosure, the formation of the dielectric layer 24 includes depositing a porogen-containing dielectric material and then performing a curing process to drive out the porogen to form a dielectric layer 24 that is porous.

Still referring to FIG. 1, a conductive feature 30 is formed in the dielectric layer 24. The conductive feature 30 may be a metal line, a conductive via, a contact plug, or the like. In accordance with some embodiments, the conductive feature 30 includes a diffusion barrier layer 26 and a conductive filling material 28 over the diffusion barrier layer 26. The diffusion barrier layer 26 may be formed of a conductive material such as titanium, titanium nitride, tantalum, tantalum nitride, the like, or combinations thereof. The conductive filling material 28 may be formed of copper, a copper alloy, aluminum, another metal or metal alloy, the like, or combinations thereof. The diffusion barrier layer 26 has the function of preventing the conductive material (such as copper) of the conductive filling material 28 from diffusing into the dielectric layer 24. In accordance with some embodiments of the present disclosure, the formation of the conductive feature 30 may also adopt the techniques as discussed subsequently, such that the bottom portion of the diffusion barrier layer 26 is either not formed.

As also shown in FIG. 1, an etch stop layer 32 is formed over the dielectric layer 24 and the conductive feature 30, in accordance with some embodiments. The etch stop layer 32 is formed of a dielectric material, which may include one or more materials such as aluminum oxide, aluminum nitride, a silicon oxide, a silicon nitride, silicon carbide, silicon oxynitride, silicon carbonitride, silicon oxycarbonitride, the like, or combinations thereof. In some cases, the use of an etch stop layer 32 that contains a metal (e.g., aluminum nitride, aluminum oxide, or the like) can form bonds with the subsequently formed sacrificial layer 48 (see FIG. 5), and thus the use of a metal-containing material for the etch stop layer can improve the blocking capability of the sacrificial layer 48. The etch stop layer 32 may be formed of a material that has a high etching selectivity relative to the overlying dielectric layer 34 such that an etching of the dielectric layer 34 may stop on the etch stop layer 32. In some embodiments, the etch stop layer 32 may have a thickness T0 that is between about 1 nm and about 10 nm.

Still referring to FIG. 1, a dielectric layer 34 is formed over the etch stop layer 32. In some embodiments, the dielectric layer 34 is an IMD or an ILD. The dielectric layer 34 may comprise a dielectric material such as an oxide, a nitride, a carbon-containing dielectric material, the like, or combinations thereof. For example, the dielectric layer 34 may be formed of PSG, BSG, BPSG, FSG, TEOS oxide, HSQ, MSQ, the like, or combinations thereof. In some embodiments, the dielectric layer 34 is a low-k dielectric layer having a dielectric constant value (k) that is lower than about 3.5 or that is lower than about 3.0.

FIGS. 2 through 6B and FIGS. 8 through 10 illustrate a process for forming a metal line 60 and a via 58 (see FIG. 10), in accordance with some embodiments. It is appreciated that the examples as shown in these figures describe a dual damascene process, but in other embodiments, a single damascene process, in which a metal line, a via, a contact plug, or the like, is formed, is also contemplated.

Figure 2:
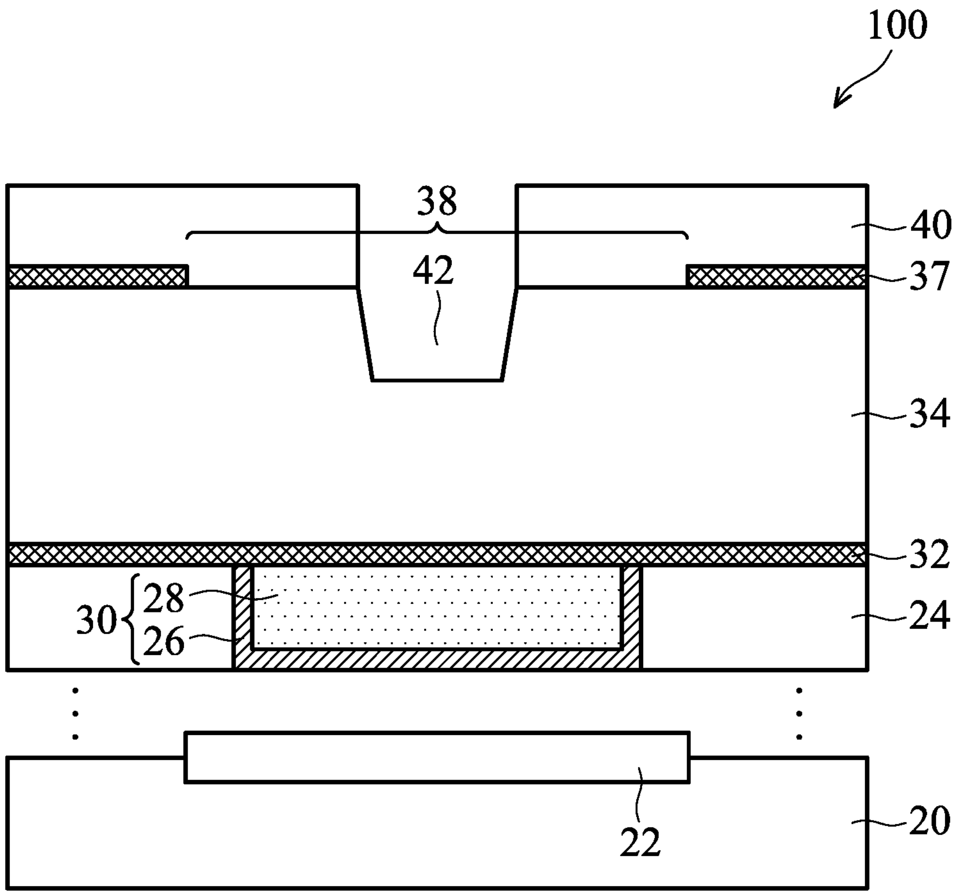
Figure 3:
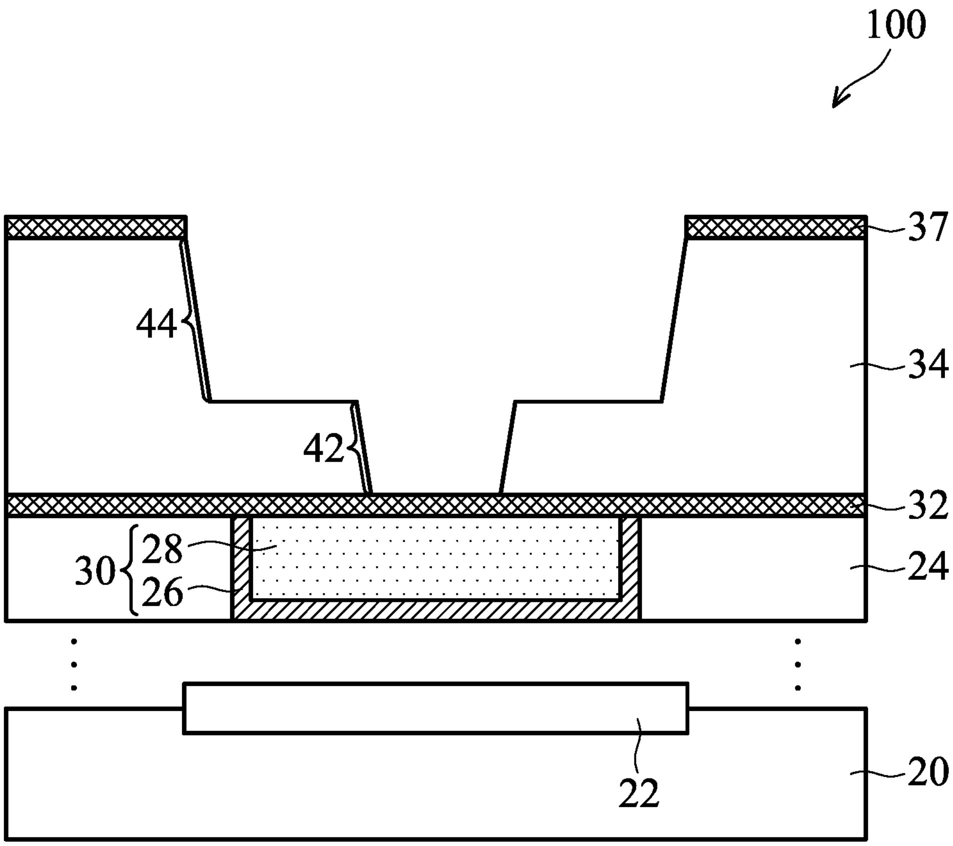

In FIGS. 2 and 3, a via opening 42 and a trench 44 are formed in the dielectric layer 34, in accordance with some embodiments. The via opening 42 and the trench 44 may be formed using, for example, photolithography and etching techniques. In an example of a process of forming the via opening 42 and the trench 44, a metal hard mask 37 is first formed over the dielectric layer 34 and then patterned to form an opening 38, as shown in FIG. 2. The metal hard mask 37 may be formed of a material such as titanium nitride, boron nitride, another metal oxide or metal nitride, the like, or a combination thereof. The opening 38 in the metal hard mask 37 defines the pattern of a trench (e.g., trench 44 shown in FIG. 3) that is subsequently filled to form a metal line (e.g., metal line 60 shown in FIG. 10).

After forming the opening 38, a photoresist 40 is formed over the dielectric layer 34 and over the metal hard mask 37. The photoresist 40 may be a single layer photoresist or a multi-layer photoresist structure (e.g., a tri-layer photoresist structure). The photoresist 40 is patterned to expose the dielectric layer 34, which may be accomplished using suitable techniques. The exposed dielectric layer 34 is then etched to form an opening 42 extending at least partially into the dielectric layer 34, as shown in FIG. 2. The etching of the dielectric layer 34 may be performed using a wet etching process and/or a dry etching process (e.g., a plasma etching process). For example, the etching of the dielectric layer 34 may be performed using a process gas comprising fluorine and carbon, wherein fluorine is used for etching, with carbon having the effect of protecting the sidewalls of the resulting opening. With an appropriate fluorine and carbon ratio, the opening 42 may be formed having a desired profile. For example, the process gases for the etching may include one or more fluorine and carbon-containing gases such as $C_4F_8$, $CH_2F_2$, $CF_4$, or the like, and may include one or more carrier gases such as Ar, $N_2$, or the like. In an example of an etching process, the flow rate of $C_4F_8$ is in the range between about 0 sccm and about 50 sccm, the flow rate of $CF_4$ is in the range between about 0 sccm and about 300 sccm (with at least one of $C_4F_8$ having a non-zero flow rate), and the flow rate of $N_2$ is in the range between about 0 sccm and about 200 sccm. As an additional example, the process gases for the etching may include $CH_2F_2$ and a carrier gas such as $N_2$. The flow rate of $CH_2F_2$ may be in the range between about 10 sccm and about 200 sccm, and the flow rate of $N_2$ may be in the range between about 50 sccm and about 100 sccm. During the etching process, package component 100 may be kept at a temperature in the range between about 30° C. and about 60° C. In the etching process, plasma may be generated from the etching gases. The Radio Frequency (RF) power of the power source for the etching may be lower than about 700 Watts, and the pressure of the process gases is in the range from about 15 mTorr and about 30 mTorr. These are examples, and other etching processes or etching parameters are possible. In some embodiments, the etching of the dielectric layer 34 may be performed for a duration of time such that the opening 42 extends to an intermediate level between a top surface and a bottom surface of the dielectric layer 34, as shown in FIG. 2. The duration of time may be predetermined.

Turning to FIG. 3, the photoresist 40 is then removed, followed by the further etching of the dielectric layer 34 using the metal hard mask 37 as an etching mask. The etching process used to etch the dielectric layer 34 may be, for example, an anisotropic etching process. The etching process extends the opening 42 into the dielectric layer 34 until the opening 42 exposes the etch stop layer 32. The etching process extends the opening 42 and also forms a trench 44 extending partially into the dielectric layer 34, as shown in FIG. 3. For the resulting structure following the etching process, the final opening 42 is referred to as the via opening 42, which is underlying and contiguous with the trench 44. The via opening 42 is subsequently filled to form a via (e.g., via 58 shown in FIG. 10).

In accordance with alternative embodiments, the via opening 42 and the trench 44 are formed in separate photolithography processes. For example, in a first photolithography process, the via opening 42 may be formed extending through the dielectric layer 34 to the etch stop layer 32. In a second lithography process, the trench 44 may be formed. Either the via opening 42 or the trench 44 may be formed before the other, in accordance with various embodiments.

Figure 4:
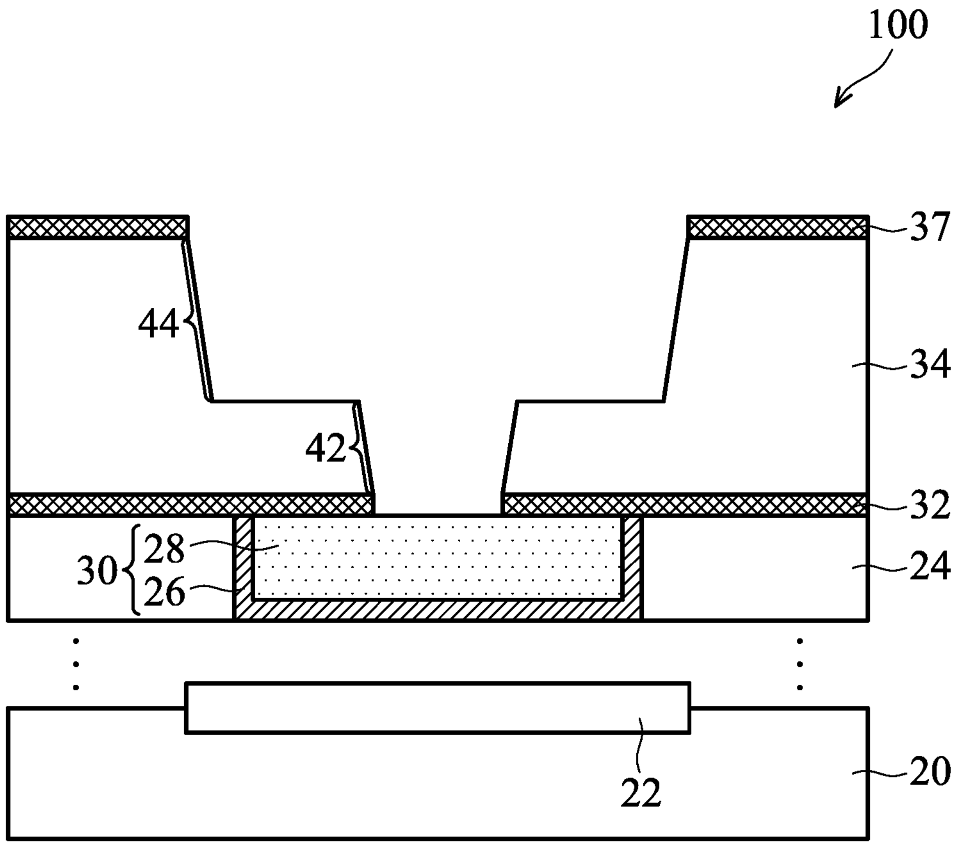

Next, referring to FIG. 4, an etching process is performed to etch through the etch stop layer 32 and expose the conductive filling material 28. In some cases, the etching process may also be referred to as a wet clean process when the etching of the etch stop layer 32 includes a wet etching process. In accordance with some embodiments of the present disclosure, the etching process uses a solution that includes glycol, dimethyl sulfide, amine, $H_2O_2$, the like, or combinations thereof. For example, glycol may be used as a surfactant, dimethyl sulfide may be used as a solvent, amine may be used to remove undesirable organic residue on surfaces of the package component 100, and/or a combination of $H_2O_2$ and amine may be used to etch the etch stop layer 32.

Figure 5:
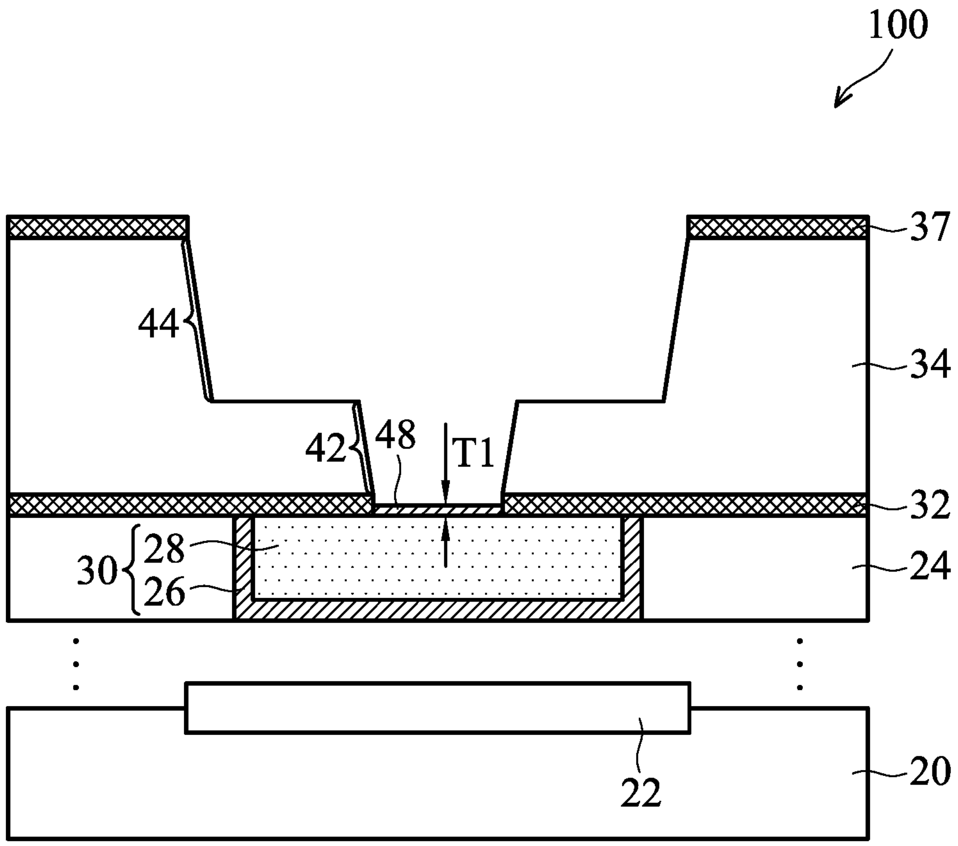
FIG. 5 illustrates a cross-sectional view of an intermediate stage in the formation of a sacrificial material, in accordance with some embodiments.

Turning to FIG. 5, a sacrificial layer 48 is then formed on the exposed surface of the conductive filling material 28, in accordance with some embodiments. The sacrificial layer 48 may be formed to block, prevent, or otherwise inhibit the subsequent formation of the barrier layer 50 on the conductive filling material 28 (see FIGS. 6A-6B). By blocking formation of the barrier layer 50 over the conductive filling material 28, the resistance of the interface between the conductive filling material 28 and the subsequently deposited conductive material 56 may be reduced. In some embodiments, the sacrificial layer 48 may extend across the via opening 42 to completely cover the exposed surface of the conductive filling material 28. In some embodiments, the sacrificial layer 48 is formed having a thickness T1 that is between about 0.5 nm and about 5 nm, such as between about 1 nm and about 2 nm. The thickness T1 of the sacrificial layer 48 may be greater than, about the same, or less than the thickness T0 of the etch stop layer 32. In this manner, the sacrificial layer 48 may be formed on sidewall surfaces of the etch stop layer 32 within the via opening 42, as shown in FIG. 5.

In accordance with some embodiments, the sacrificial layer 48 comprises a material that adheres or bonds to the conductive filling material 28 and does not adhere or bond to the dielectric layer 34. For example, the material may form chelation bonds with metal (e.g., copper or aluminum) in the conductive filling material 28 but not form bonds with the dielectric layer 34. In some cases, the sacrificial layer 48 can form chelation bonds with an etch stop layer 32 that contains a metal (e.g., aluminum). Thus, since the sacrificial layer 48 may form bonds with both the conductive filling material 28 and a metal-containing etch stop layer 32, the use of a metal-containing etch stop layer 32 can allow for more complete covering of the conductive filling material 28 by the sacrificial layer 48. For example, the thickness of the sacrificial layer 48 at a metal-containing etch stop layer 32 may be greater than the thickness of the sacrificial layer 48 at an etch stop layer 32 that does not contain metal (such as, for example, an etch stop layer 32 formed from a silicon oxycarbohydride or the like). In this manner, the subsequently formed barrier layer 50 (see FIG. 6) may be formed on the dielectric layer 34 but be blocked from forming on the conductive filling material 28. Additionally, the sacrificial layer 48 may be a material to which the subsequently formed barrier layer 50 is unlikely or unable to adhere or bond. For example, the chemical structure of the material may be hydrophobic and/or include non-polar groups to which precursors of the barrier layer 50 are unlikely or unable to bond, or the chemical structure of the material may inhibit adsorption of precursors of the barrier layer 50 due to steric hindrance. The material of the sacrificial layer 48 may be chosen such that precursors of the subsequently formed barrier layer 50 have a high selectivity of adsorption on the dielectric layer 34 over the sacrificial layer 48. For example, the selectivity of adsorption on the dielectric layer 34 versus adsorption on the sacrificial layer 48 may be greater than about 5:1, such as about 7.5:1, about 30:1, or greater than 30:1. The selectivity may depend on the various materials and/or formation processes used. In this manner, the sacrificial layer 48 is not covered (or only partially covered) by the barrier layer 50 and thus the sacrificial layer 48 may be more easily removed by the post-deposition treatment 52, described below for FIG. 8. In some cases, these material properties of the sacrificial layer 48 may cause an amount of the material of the sacrificial layer 48 to adhere or bond to the metal hard mask 37 in addition to the conductive filling material 28, though in other cases no material is formed on the metal hard mask 37. The sacrificial layer 48 may be deposited by a suitable technique such as a wet chemical soak or exposure to chemical gas, which may depend on the particular material(s) comprising the sacrificial layer 48.

As a first example, the sacrificial layer 48 may include benzotriazole (BTA), which has the chemical formula $C_6H_4N_3H$. BTA molecules have a first side with three nitrogen atoms that can bond to a metal such as copper and a second side which has a hydrophobic benzo ring to which precursors of the barrier layer 50 are unable to bond. The first side of the BTA molecule can bond to the conductive filling material 28 while the second side protrudes and blocks precursors from bonding to the conductive filling material 28. In this manner, a sacrificial layer 48 comprising a monolayer of BTA or multiple monolayers of BTA can prevent the barrier layer 50 from forming on the conductive filling material 28 or on the sacrificial layer 48. In some embodiments, a sacrificial layer 48 may be formed from BTA by soaking the package component 100 in a wet chemical solution containing BTA. For example, BTA may be part of a solution containing $H_2O$ and/or $H_2O_2$, though solutions having other compositions may be used. The solution may be heated to a temperature between about 25° C. and about 50° C., and the package component 100 may be soaked for a duration of time between about 10 seconds and about 60 seconds. A wet clean process may be performed on the package component 100 after soaking in the solution. A sacrificial layer 48 including BTA may be formed using other solutions, process conditions, or techniques than these. The material and deposition technique described is an example, and the sacrificial layer 48 may be formed from other materials using a wet chemical soak process, such as bis-triazolyl indoleamine, thiol, phosphate the like, or combinations thereof.

As a second example, the sacrificial layer 48 may include 5-Decyne, which has the chemical formula $C_{10}H_{18}$. 5-Decyne molecules can form bonds to metals such as copper and also can attach to each other through van der Waals forces, but 5-Decyne molecules do not bond to the dielectric layer 34. Additionally, precursors of the barrier layer 50 do not form bonds to 5-Decyne molecules. In this manner, a sacrificial layer 48 comprising a layer of 5-Decyne molecules can prevent the barrier layer 50 from forming on the conductive filling material 28 or on the sacrificial layer 48. In some embodiments, a sacrificial layer 48 may be formed from 5-Decyne by exposing the package component 100 to a gas mixture including 5-Decyne molecules. For example, the 5-Decyne may be part of a gas mixture including carrier gases such as He, Ar, or the like, though other mixtures may be used. The gas mixture may be flowed into a process chamber, which may be the same process chamber in which other processes are performed, such as etching processes, deposition of the barrier layer 50, post-deposition treatment 52, or other processes. By depositing the sacrificial layer 48 "in-situ" in this manner, contamination, cost, or overall processing time for the package component 100 may be reduced. The gas mixture may be flowed into the process chamber at a flow rate between about 600 sccm and about 3000 sccm for a time duration between about 10 seconds and about 120 seconds. A process temperature between about 100° C. and about 350° C. may be used, and a process pressure between about 1 Torr and about 30 Torr may be used. A sacrificial layer 48 including 5-Decyne may be formed using other gas mixtures, process conditions, or techniques than these. The material and deposition technique described is an example, and the sacrificial layer 48 may be formed from other materials using a gas deposition process, such as gas phase thiol, gas phase BTA, alkynes, alkenes, the like, or combinations thereof.

Figure 6A:
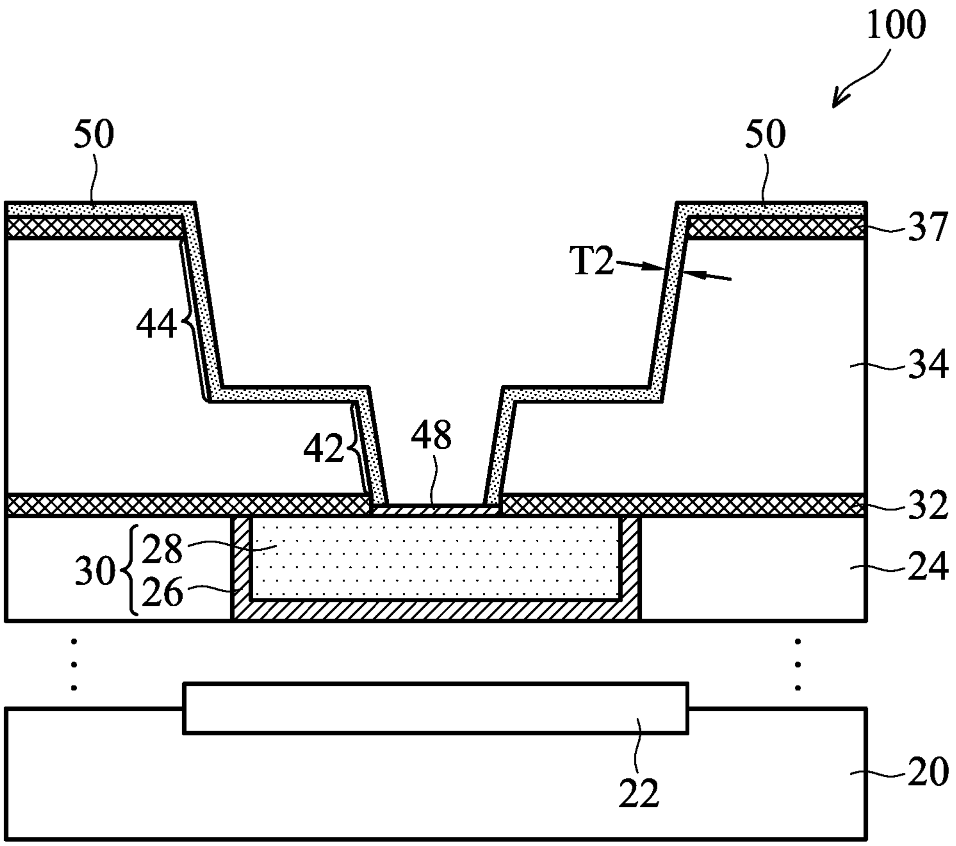
FIGS. 6A and 6B illustrate cross-sectional views of intermediate stages in the formation of a barrier layer, in accordance with some embodiments.
Figure 6B:
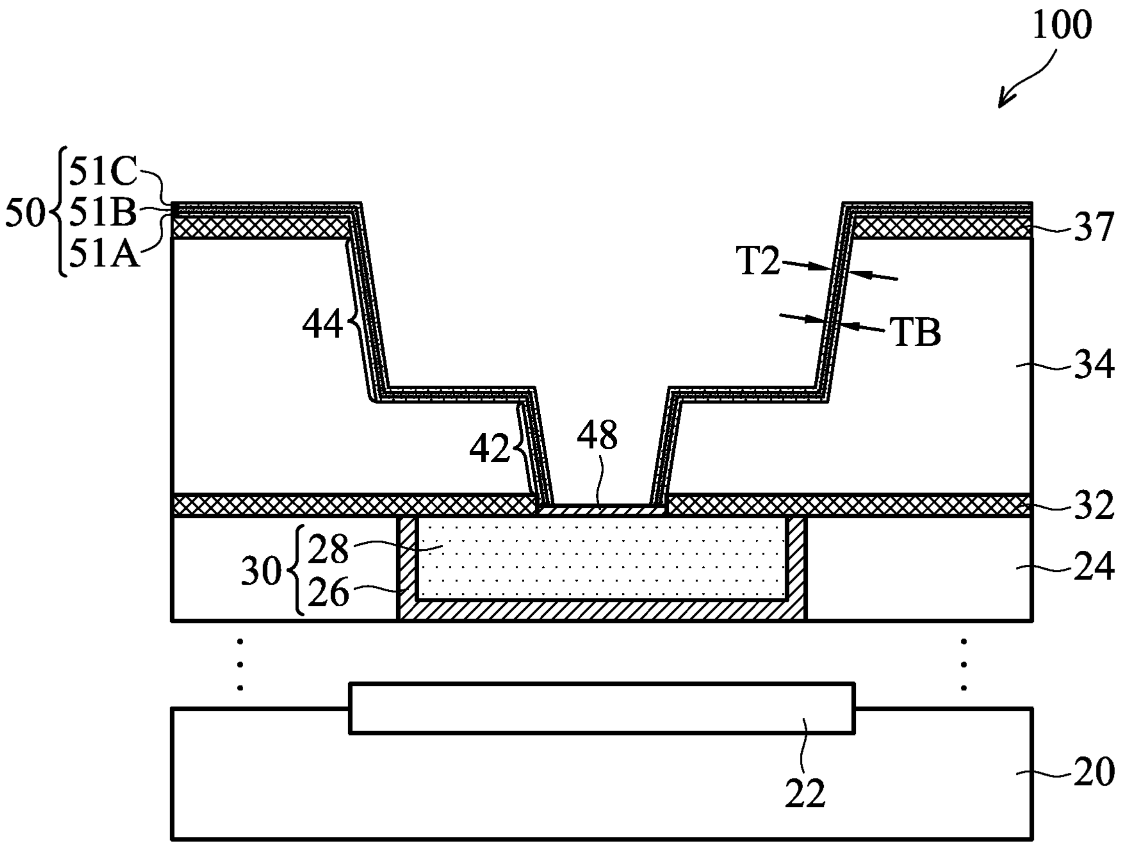

Turning to FIGS. 6A and 6B, a conductive barrier layer 50 is deposited on surfaces within the via opening 42 and the trench 44, in accordance with some embodiments. The barrier layer 50 has the function of preventing atoms in the subsequently deposited conductive material 56 (FIG. 9) from diffusing into dielectric layer 34. The barrier layer 50 is formed over exposed surfaces of the dielectric layer 34 and the etch stop layer 32, but is blocked from forming on the conductive filling material 28 by the sacrificial layer 48. Additionally, the barrier layer 50 does not significantly form on exposed surfaces of the sacrificial layer 48, as described previously. The barrier layer 50 may comprise a barrier material such as titanium, titanium nitride, tantalum, tantalum nitride, the like, or a combination thereof. In some embodiments, the barrier layer 50 additionally comprises a doping metal, which may be a transition metal such as Ru, Co, Mn, Al, Nb, or the like; another type of metal; the like; or a combination thereof. The inclusion of the doping metal within the barrier layer 50 allows for a denser barrier layer 50 that provides better protection against diffusion, and the inclusion of the doping metal can also improve the thermal stability and the adhesion of the barrier layer 50. FIG. 6A illustrates an embodiment in which a doping metal (e.g., Ru) is deposited along with a barrier material (e.g., TaN) to form the barrier layer 50, and FIG. 6B illustrates an embodiment in which the barrier layer 50 includes a sublayer 51B of a doping metal (e.g., Ru) between two sublayers 51A, 51C of a barrier material (e.g., TaN). In some cases, by forming a barrier layer 50 that includes doping metal, a barrier layer 50 may be formed having an overall density that is greater than about 13 $g/cm^3$.

In some embodiments, the barrier layer 50 may be deposited using a suitable process, such as an ALD process and/or a CVD process. In some cases, forming the barrier layer 50 using an ALD process and/or a CVD process may allow for better step coverage and better conformity compared with other processes, such as a PVD process. In some embodiments, the deposition of the barrier layer 50 may be performed in the same process chamber as the formation of the sacrificial layer 48. In some embodiments, the barrier layer 50 may be formed having a thickness T2 that is between about 10 Å and about 60 Å, such as about 15 Å.

Turning to FIG. 6A, the barrier layer 50 may be deposited using a process that deposits both a barrier material and a doping metal. The barrier layer 50 may be deposited such that the barrier layer 50 includes a desired concentration of the doping metal. In some embodiments, the barrier layer 50 may be formed having a concentration of doping metal that is between about 5% atomic percent and about 30% atomic percent, though other concentrations are possible. In some cases, a higher concentration of doping metal reduces the resistivity of the barrier layer 50. For example, a barrier layer 50 of TaN doped with a 10% atomic percentage of Ru can have a resistivity that is about 59% of the resistivity of a barrier layer 50 of undoped TaN, and a barrier layer 50 of TaN doped with a 20% atomic percentage of Ru can have a resistivity that is about 17% of the resistivity of a barrier layer 50 of undoped TaN. These are examples, and the reduction of resistivity may be different in other cases. In some embodiments, the resistivity of the barrier layer 50 may be further reduced by performing the post-deposition treatment 52 (see FIG. 8). Additionally, a higher concentration of doping metal can result in a denser barrier layer 50, and can result in a barrier layer 50 having a lower concentration of nitrogen following the post-deposition treatment 52.

The barrier layer 50 may be deposited using an ALD process comprising an ALD cycle being performed one or more times, in which each ALD cycle deposits a layer of material. An ALD cycle may include the introduction of a precursor of the barrier material into the process chamber followed by a purging of the process chamber using a purging gas, and then the introduction of a precursor of the doping metal into the process chamber followed by a purging of the process chamber. The barrier material and/or the doping metal may have more than one precursor, each of which may be introduced into the process chamber and followed by a corresponding purge. An ALD cycle may be repeated multiple times to deposit the barrier layer 50 to a desired thickness T2. For example, an ALD cycle may be performed between about 10 and about 80 times, though the ALD cycle may be performed for more or fewer times than these.

Figure 7A:
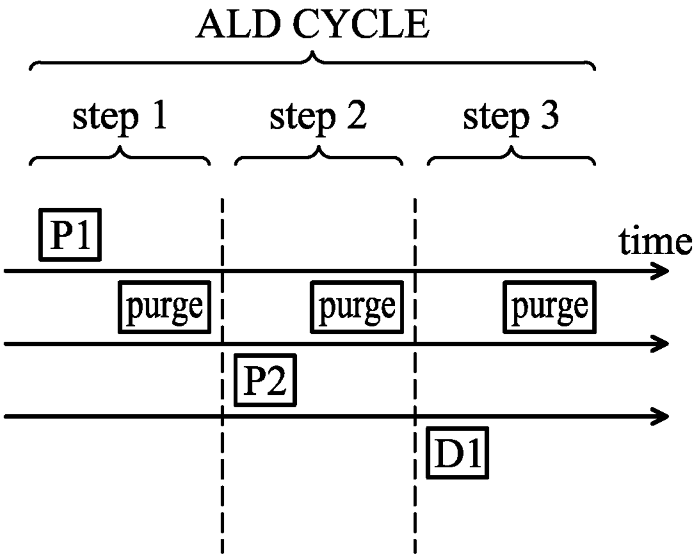
FIGS. 7A and 7B illustrate deposition cycles used during the formation of a barrier layer, in accordance with some embodiments.

Turning to FIG. 7A, an example ALD cycle of an ALD process for depositing a barrier layer 50 is shown, in accordance with some embodiments. The ALD cycle shown in FIG. 7A may be used to deposit a barrier layer 50 similar to that shown in FIG. 6A, though other ALD cycles may be used in other cases. The example ALD cycle shown in FIG. 7A has three steps. In the first step of the ALD cycle, a first precursor P1 of the barrier material is flowed into the process chamber for a duration of time and then a purging gas is flowed into the process chamber for a duration of time. In the second step, a second precursor P2 of the barrier material is flowed into the process chamber and then the purging gas is flowed into the process chamber. In this example ALD cycle, step 1 and step 2 together form one or more monolayers of the barrier material. In the third step, a precursor D1 of the doping metal is flowed into the process chamber and then the purging gas is flowed into the process chamber. In some cases, the concentration of doping metal within the barrier layer 50 may be controlled by controlling the parameters of the third step, such as the flow rate of the precursor D1 or the duration of time the precursor D1 is flowed into the process chamber. For example, a greater flow rate of D1 or a flowing D1 for a longer duration of time can cause more doping metal to be formed on the barrier material surface after step 2, and thus can increase the concentration of doping metal in the barrier layer 50. In some cases, step 3 may be skipped in some of the individual ALD cycles that form the barrier layer 50, which may result in a lower concentration of doping metal in the barrier layer 50.

In accordance with some embodiments of the present disclosure, the barrier layer 50 comprises TaN as a barrier material and Ru or Co as a doping metal, and is deposited using an ALD process. The precursors of TaN may include, for example, Pentakis Dimethylamino Tantalum ("PDMAT") as a first precursor (e.g., P1 in FIG. 7A), which has the chemical formula $C_{10}H_{30}N_5Ta$, and ammonia as a corresponding second precursor (e.g., P2), which has the chemical formula $NH_3$. In some embodiments, depositing Ru as a doping metal may use ruthenium tricarbonyl (1-methyl-1,4 cyclohexadiene) ("CHORuS") as a precursor (e.g., D1), and depositing Co as a doping metal may use cobalt carbonyl tertiary-butyl acetylene ("CCTBA") as a precursor (e.g., D1). Other precursors or combinations of precursors may be used for forming the barrier material or the doping metal. In some embodiments, in an ALD cycle, PDMAT is flowed into the process chamber at a flow rate between about 500 sccm and about 1500 sccm, and ammonia is flowed into the process chamber at a flow rate between about 500 sccm and about 3000 sccm. In some embodiments, the PDMAT is flowed for between about 1 second and about 5 seconds, and the ammonia is flowed for between about 1 second and about 5 seconds. In some embodiments, CHORuS is flowed into the process chamber at a flow rate between about 50 sccm and about 300 sccm, and is flowed for a duration of time between about 1 second and about 10 seconds. The purging gas may be, for example, Ar, which may be flowed into the process chamber at a purging flow rate between about 1000 sccm and about 3000 sccm, and which may be flowed for between about 1 second and about 5 seconds. In some embodiments, the ALD cycles are performed at a process temperature between about 200° C. and about 350° C. and at a process pressure between about 1 Torr and about 5 Torr. Other process parameters than these are possible.

Turning to FIG. 6B, the barrier layer 50 may be formed by depositing alternating sublayers of barrier material and doping metal, in accordance with some embodiments. For example, FIG. 6B illustrates an embodiment in which a sublayer 51A of barrier material is deposited, then a sublayer 51B of doping metal is deposited over the sublayer 51A, and then a sublayer 51C of the barrier material is deposited over the sublayer 51B. FIG. 6B shows an embodiment of a barrier layer 50 having a single sublayer of doping metal between two sublayers of barrier material, but in other embodiments the barrier layer 50 may have more sublayers of doping metal or more sublayers of barrier material than shown. In some embodiments, a sublayer(s) of doping metal may have a thickness TB that is between about 1 Å and about 6 Å, such as about 3 Å. In some embodiments, sublayers of barrier material may have a thickness that is between about 10 Å and about 60 Å, such as about 20 Å. Different sublayers of a barrier layer 50 may have different thicknesses, including different sublayers of the same material. More sublayers and/or thicker sublayers of doping metal can increase the overall density of the barrier layer 50 and thus can improve the ability of the barrier layer 50 to block diffusion.

In some embodiments, the barrier layer 50 is formed using a deposition process comprising an ALD cycle performed one or more times to deposit a sublayer of barrier material (e.g., sublayer 51A) followed by a CVD process to deposit a sublayer of doping metal (e.g., sublayer 51B). By repeating the deposition process, alternating layers of barrier material and doping metal may be deposited to form the barrier layer 50. A final sublayer of barrier material (e.g., sublayer 51C) may be deposited. In some embodiments, the ALD cycle may be performed between once and about 10 times to deposit a sublayer of barrier material to a desired thickness, though the ALD cycle may be performed more times in other embodiments. The ALD cycle(s) and the CVD process may be performed using the same process chamber.

Figure 7B:
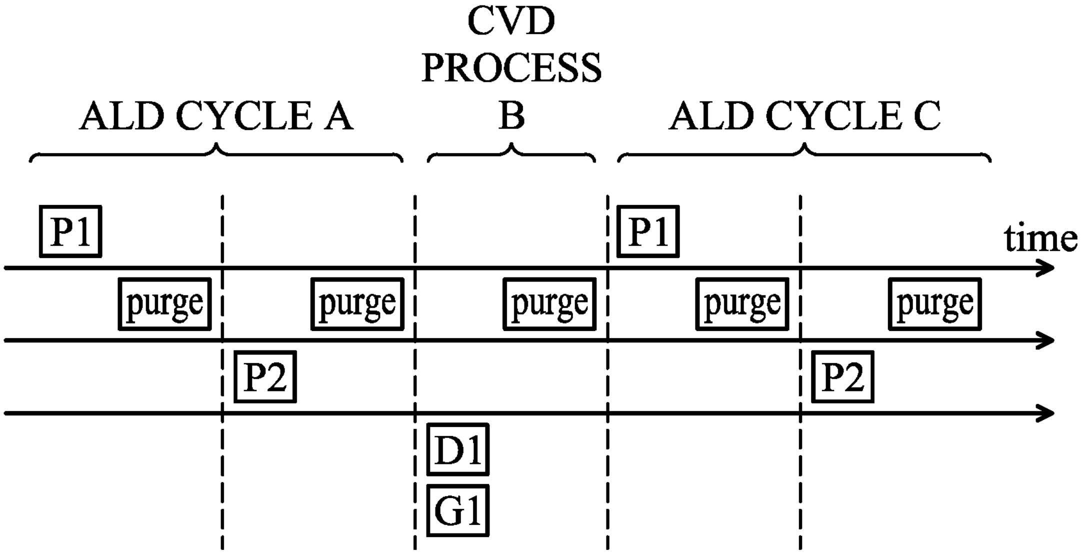

Turning to FIG. 7B, an example deposition process for depositing a barrier layer 50 is shown, in accordance with some embodiments. The deposition process shown in FIG. 7B may be used to deposit a barrier layer 50 similar to that shown in FIG. 6B, though other deposition processes may be used in other cases. The example deposition process shown in FIG. 7B has three stages, including a first ALD cycle labeled as "ALD cycle A," a CVD process labeled as "CVD process B," and a second ALD cycle labeled as "ALD cycle C." In the first stage, the ALD cycle A is performed one or more times to deposit a sublayer of barrier material (e.g., sublayer 51A). The ALD cycle A may include steps similar to the ALD cycle shown in FIG. 7A. For example, the ALD cycle A may include a first step similar to step 1 of FIG. 7A and a second step similar to step 2 of FIG. 7A. In the second stage, the CVD process B is performed to deposit a sublayer of doping metal (e.g., sublayer 51B). The CVD process B may include, for example, flowing a precursor D1 of the doping metal into the process chamber and then flowing a purging gas into the process chamber. Other gases G1 may be also be flowed into the process chamber while the precursor D1 is flowed. In some cases, the thickness of a sublayer of doping metal may be controlled by controlling the parameters of the CVD process B, such as the flow rate of the precursor D1 or the duration of time the precursor D1 is flowed into the process chamber. For example, a greater flow rate of D1 or flowing D1 for a longer duration of time can deposit a thicker layer of doping metal on the barrier material surface.

In accordance with some embodiments of the present disclosure, the barrier layer 50 includes barrier material sublayers comprising TaN and doping metal sublayer(s) comprising Ru. The precursors of TaN (e.g., P1 and P2) may include, for example, PDMAT and ammonia. The precursor of Ru (e.g., D1) may include, for example, CHORuS. Other precursors or combinations of precursors may be used for forming the barrier material or the doping metal. The gas G1 may include, for example, $H_2$, another gas, or a mixture of gases. In some embodiments, in an ALD cycle, PDMAT is flowed into the process chamber at a flow rate between about 500 sccm and about 1500 sccm, and ammonia is flowed into the process chamber at a flow rate between about 500 sccm and about 3000 sccm. In some embodiments, the PDMAT is flowed for between about 1 second and about 5 seconds, and the ammonia is flowed for between about 1 second and about 5 seconds. In some embodiments, the ALD cycles are performed at a process temperature between about 200° C. and about 350° C. and at a process pressure between about 1 Torr and about 5 Torr. In some embodiments, in a CVD process, CHORuS is flowed into the process chamber at a flow rate between about 50 sccm and about 300 sccm, and is flowed for a duration of time between about 1 second and about 10 seconds. In some embodiments, $H_2$ is flowed into the process chamber at a flow rate between about 500 sccm and about 5000 sccm, and is flowed for a duration of time between about 1 second and about 10 seconds. CHORuS and $H_2$ may be flowed into the process chamber at the same time. In some embodiments, the CVD process is performed at a process temperature between about 150° C. and about 300° C. and at a process pressure between about 1 Torr and about 15 Torr. The purging gas may be, for example, Ar, which may be flowed into the process chamber at a purging flow rate between about 1000 sccm and about 3000 sccm, and which may be flowed for between about 1 second and about 5 seconds. Other process parameters than these are possible.

Figure 8:
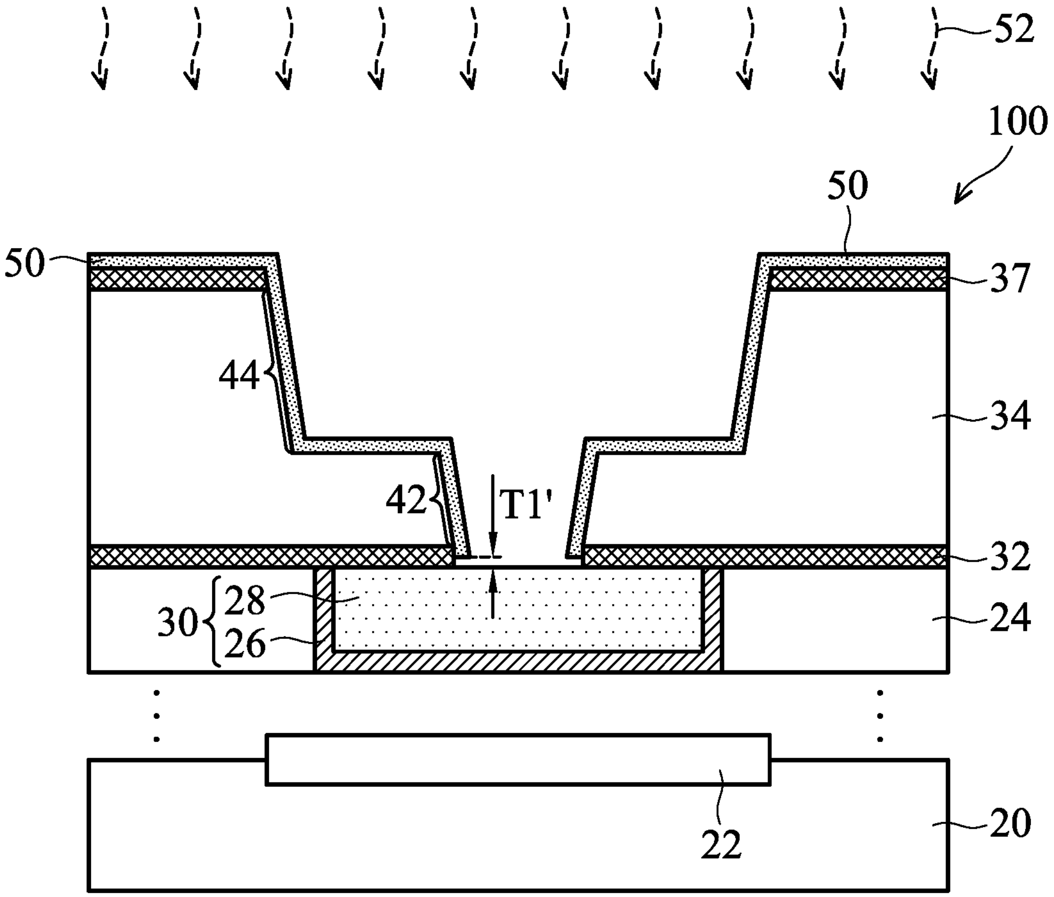
FIGS. 8, 9, and 10 illustrate cross-sectional views of intermediate stages in the formation of a metal line and a via, in accordance with some embodiments.

Turning to FIG. 8, a post-deposition treatment 52 is performed to remove the sacrificial layer 48 and expose the conductive filling material 28, in accordance with some embodiments. The post-deposition treatment 52 may improve the performance of the barrier layer 50 by reducing the nitrogen content of the barrier layer 50 and by reducing the resistivity of the barrier layer 50. In some cases, the post-deposition treatment 52 may also improve adhesion of the barrier layer 50. After performing the post-deposition treatment 52, the barrier layer 50 may be separated from the conductive filling material 28 by a distance T1' that may be approximately equal to the thickness T1 of the sacrificial layer 48. For example, the distance T1' may be between about 0.5 nm and about 5 nm, though other distances are possible. As shown in FIG. 8, the post-deposition treatment 52 may expose sidewalls of the etch stop layer 32 that were previously covered by the sacrificial layer 48.

In some embodiments, the post-deposition treatment 52 includes a thermal treatment such as an anneal process. For example, the anneal process may include annealing the package component 100 in an anneal chamber at a temperature between about 250° C. and about 400° C. for a duration of time between about 30 seconds and about 300 seconds. The package component 100 may be exposed to one or more gases during the anneal process, such as an inert gas (e.g., He, Ar or the like), a reducing gas (e.g., $H_2$ or the like), or a combination thereof. The gas(es) may be flowed into the anneal chamber at a flow rate between about 600 sccm and about 3000 sccm. During the anneal process, the anneal chamber may have a pressure between about 1 Torr and about 30 Torr. A post-deposition treatment 52 including an anneal process may have other annealing parameters than these. In some embodiments, the anneal chamber is the same chamber as the process chamber used for depositing the barrier layer 50.

In some embodiments, the post-deposition treatment 52 includes a plasma treatment. For example, the plasma treatment may include exposing the package component 100 to a plasma of one or more process gases such as $H_2$, $NH_3$, Ar, the like, or combinations thereof. The process gas(es) may be flowed at a flow rate between about 600 sccm and about 3000 sccm. The plasma treatment may be performed at a pressure between about 0.1 Torr and about 5 Torr. In some embodiments, the plasma is generated using a power between about 100 Watts and about 600 Watts. The plasma treatment may be performed at a temperature between about 25° C. and about 400° C., and may be performed for a duration of time between about 10 seconds and about 30 seconds. A post-deposition treatment 52 including a plasma treatment may have other parameters than these. In some embodiments, the plasma treatment is performed using the same chamber as the process chamber used for depositing the barrier layer 50. In some embodiments, one of an anneal process or a plasma treatment is performed. In other embodiments both an anneal process and a plasma treatment are performed, which may be performed in either order.

The post-deposition treatment 52 may reduce the concentration of nitrogen within the barrier layer 50, which can densify the barrier layer 50. By increasing the density of barrier layer 50 in this manner, the barrier layer 50 may be made more effective at blocking diffusion into the dielectric layer 34. In some cases, the post-deposition treatment 52 may reduce the ratio of nitrogen to tantalum (N:Ta) in the barrier layer 50 by about half. In some cases, the barrier layer 50 may have a N:Ta ratio of about 0.65:1 after performing the post-deposition treatment 52. It should be noted, however, that the nitrogen reduction may be greater or smaller than these examples depending on the process details of the post-deposition treatment 52 and/or the composition of the barrier layer 50.

The post-deposition treatment 52 may reduce the resistivity of the barrier layer 50, which can improve device performance. For example, the barrier layer 50 after performing the post-deposition treatment 52 may have a resistivity that is about 7% of the resistivity of the barrier layer 50 before performing the post-deposition treatment 52. In some cases, the barrier layer 50 may have a resistivity that is less than 200 μΩ-cm after performing the post-deposition treatment. It should be noted, however, that the resistivity reduction may be greater or smaller than these examples depending on the process details of the post-deposition treatment 52 and/or the composition of the barrier layer 50.

Figure 9:
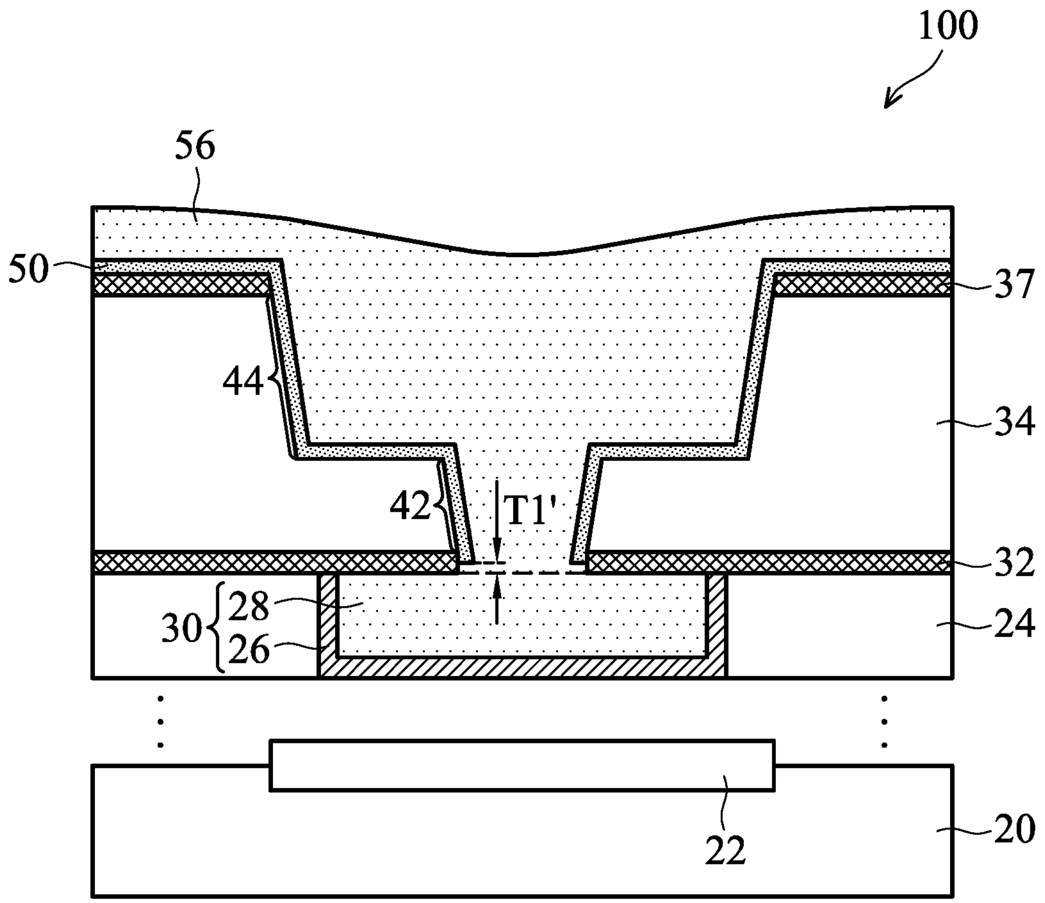

Turning to FIG. 9, a conductive material 56 is deposited to fill the via opening 42 and the trench 44, in accordance with some embodiments. The conductive material 56 may be deposited, for example, by performing a blanket deposition to form a metal seed layer (e.g., a copper layer) using Physical Vapor Deposition (PVD), and then filling the rest of via opening 42 and trench 44 using, for example, electroplating, electro-less plating, deposition, or the like. The conductive material 56 may include copper, a copper alloy, cobalt, tungsten, the like, other metals, or combinations thereof.

By blocking the barrier layer 50 from forming on the conductive filling material 28 (see FIGS. 6A-B), the conductive material 56 is deposited on the exposed conductive filling material 28, forming a "barrier-free" interface between the conductive material 56 and the conductive filling material 28. In some cases, the contact resistance (Rc) of this barrier-free interface is smaller than if the barrier layer 50 extended between the conductive material 56 and the conductive filling material 28. Additionally, by forming the conductive material 56 on the conductive filling material 28, the thermal stability of the interface between the conductive material 56 and the conductive filling material 28 may be improved. In this manner, the techniques described herein may allow for the formation of a dense barrier layer 50 (by incorporating doping metal) and for improved contact resistance between a via 58 and a metal line 60 (see FIG. 10). As shown in FIG. 9, due to separation distance T1' between the barrier layer 50 and the conductive filling material 28, the conductive material 56 may contact sidewalls of the etch stop layer 32 that are not covered by the barrier layer 50. In this manner, portions of the conductive material 56 may extend under the barrier layer 50, and the interface between the conductive material 56 and the conductive filling material 28 may be formed having a greater lateral width.

Figure 10:
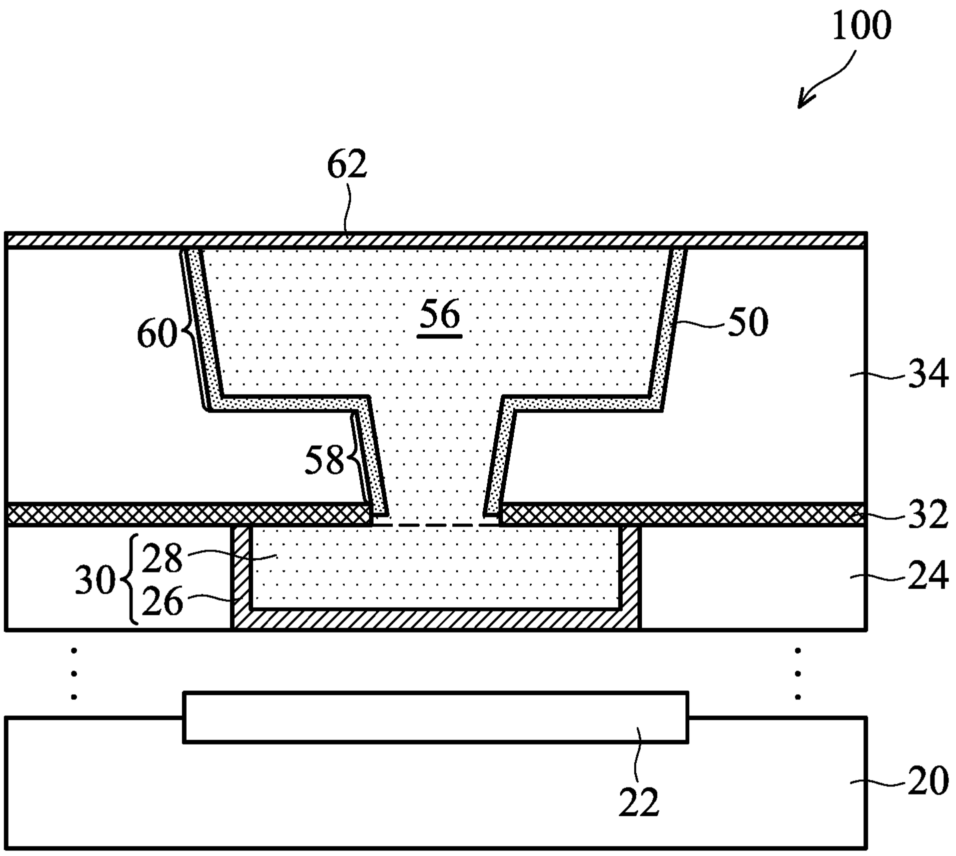

Turning to FIG. 10, a planarization process such as a Chemical Mechanical Planarization (CMP) process, a mechanical polish process, and/or a grinding process may be performed to remove excess portions of conductive material 56, hence forming the via 58 and the metal line 60, in accordance with some embodiments. The via 58 and the metal line 60 each include a portion of the barrier layer 50 and a portion of the conductive material 56. FIG. 10 also illustrates the formation of dielectric etch stop layer 62, which covers and contacts the dielectric layer 34 and the metal line 60. In accordance with some embodiments, the dielectric etch stop layer 62 is formed of one or more layers of metal oxide, metal nitride, metal carbonitride, silicon nitride, the like, or combinations thereof.

The embodiments of the present disclosure have some advantageous features. By using a sacrificial layer to block formation of the barrier layer on a conductive feature, conductive material (e.g., of a via) may be formed directly contacting the conductive feature. This can reduce the contact resistance of the interface between the conductive feature and the conductive material, which can improve device performance. This can also improve thermal stability of the interface, which can reduce time-dependent dielectric breakdown (TDDB) of the device and improve yield. Additionally, by forming a barrier layer incorporating a doping metal, the density of the barrier layer may be increased, which can improve the diffusion-blocking capability of the barrier layer. This can also allow an effectively dense barrier layer to be formed using a more conformal process such as ALD or CVD instead of less conformal deposition processes. The doping metal may be incorporated throughout the barrier layer or formed as one or more sublayers of the doping metal within the barrier layer. A barrier layer formed in this manner may also have improved adhesion and improved resistivity.

In accordance with some embodiments of the present disclosure, a method of forming a semiconductor device includes forming a conductive feature in a first dielectric layer; forming a second dielectric layer over the conductive feature; etching an opening through the second dielectric layer, the etching exposing a surface of the conductive feature; depositing a sacrificial layer in the opening, wherein the sacrificial layer selectively forms on the exposed surface of the conductive feature more than on surfaces of the second dielectric layer; depositing a barrier layer in the opening, wherein the barrier layer selectively forms on surfaces of the second dielectric layer over the sacrificial layer, wherein depositing the barrier layer includes depositing a conductive barrier material from one or more first precursors; and after depositing the conductive barrier material, depositing a doping metal from one or more second precursors; removing the sacrificial layer; and depositing a conductive material to fill the opening, the conductive material contacting the conductive feature. In an embodiment, removing the sacrificial layer includes performing a plasma treatment process. In an embodiment, the plasma treatment process increases the density of the barrier layer. In an embodiment, depositing the barrier layer includes an Atomic Layer Deposition (ALD) process. In an embodiment, the conductive barrier material includes a Chemical Vapor Deposition (CVD) process. In an embodiment, the sacrificial layer is formed by applying benzotriazole (BTA) on the exposed surface of the conductive feature. In an embodiment, the doping metal is ruthenium. In an embodiment, the conductive barrier material is tantalum nitride. In an embodiment, depositing the conductive barrier material includes depositing a first layer of the conductive barrier material, wherein depositing the doping metal includes depositing a layer of the doping metal, and further includes depositing a second layer of the conductive barrier material on the layer of the doping metal.

In accordance with some embodiments of the present disclosure, a method includes forming an insulating layer over a conductive feature; etching the insulating layer to expose a first surface of the conductive feature; covering the first surface of the conductive feature with a sacrificial material, wherein the sidewalls of the insulating layer are free of the sacrificial material; covering the sidewalls of the insulating layer with a barrier material, wherein the first surface of the conductive feature is free of the barrier material, wherein the barrier material includes tantalum nitride (TaN) doped with a transition metal; removing the sacrificial material; and covering the barrier material and the first surface of the conductive feature with a conductive material. In an embodiment, the method includes forming an etch stop layer over the conductive feature. In an embodiment, the barrier layer has an atomic percentage of the transition metal in the range between 5% and 30%. In an embodiment, the sacrificial material includes benzotriazole (BTA). In an embodiment, removing the sacrificial material includes a thermal treatment using hydrogen ($H_2$) as a process gas.

In accordance with some embodiments of the present disclosure, a structure includes a first conductive feature in a first dielectric layer; an etch stop layer over the first conductive feature; a second dielectric layer over the etch stop layer; and a second conductive feature extending through the second dielectric layer and the etch stop layer to physically contact the first conductive feature, wherein the second conductive feature includes a barrier layer extending continuously on sidewalls of the second dielectric layer and on sidewalls of the etch stop layer, wherein the barrier layer includes a layer of a transition metal between a first layer of a metal nitride and a second layer of the metal nitride; and a conductive filling material over the barrier layer, wherein the conductive filling material extends between the barrier layer and the first conductive feature. In an embodiment, the barrier layer partially covers a sidewall of the etch stop layer. In an embodiment, the conductive filling material physically contacts sidewalls of the etch stop layer. In an embodiment, the transition metal is ruthenium. In an embodiment, the layer of the transition metal has a thickness in the range between 1 Å and 6 Å. In an embodiment, a bottom of the barrier layer is vertically separated from a top of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:

a first conductive feature in a first dielectric layer;

an etch stop layer over the first conductive feature;

a second dielectric layer over the etch stop layer; and a second conductive feature extending through the second dielectric layer and the etch stop layer to physically contact the first conductive feature, wherein the second conductive feature comprises:

a barrier layer extending continuously on sidewalls of the second dielectric layer and on sidewalls of the etch stop layer, wherein the barrier layer comprises a layer of a transition metal between a first layer of a metal nitride and a second layer of the metal nitride, wherein the metal nitride is free of the transition metal, wherein each of the layer of the transition metal, the first layer of the metal nitride, and the second layer of the metal nitride is a single layer of a respective material, wherein the transition metal is ruthenium, and the metal nitride is tantalum nitride; and a conductive filling material over the barrier layer, wherein the first layer of the metal nitride directly contacts and extends along the sidewalls of the second dielectric layer and the sidewalls of the etch stop layer, wherein the second layer of the metal nitride directly contacts and extends along sidewalls of the conductive filling material, wherein the layer of the transition metal is interposed between, and directly contacts, the first layer of the metal nitride and the second layer of the metal nitride, wherein the barrier layer directly contacts and extends along an upper portion of the sidewalls of the etch stop layer, wherein the conductive filling material directly contacts and extends along a lower portion of the sidewalls of the etch stop layer and directly contacts a bottom of the barrier layer facing the first conductive feature.

2. The structure of claim 1, wherein the layer of the transition metal has a thickness in a range between 1 Å and 6 Å.

3. The structure of claim 1, wherein the bottom of the barrier layer is vertically separated from a top of the first conductive feature.

4. The structure of claim 1, wherein the second conductive feature comprises a lower portion and an upper portion, wherein the lower portion has a smaller width than the upper portion.

5. The structure of claim 1, wherein an upper surface of the first conductive feature facing the second dielectric layer is substantially level with an upper surface of the first dielectric layer.

6. The structure of claim 5, wherein the upper surface of the first conductive feature is free of the barrier layer.

7. A device comprising:

a first conductive feature over a substrate;

an etch stop layer extending along an upper surface of the first conductive feature distal from the substrate;

a first insulating layer over the first conductive feature and the etch stop layer; and a via on the first conductive feature and within the first insulating layer, wherein the via comprises:

a conductive material; and a barrier layer between the conductive material and the first insulating layer, wherein the barrier layer and the conductive material comprise different materials, wherein the barrier layer comprises a layer of a second transition metal interposed between a first layer of a nitride of a first transition metal and a second layer of the nitride of the first transition metal, wherein the first transition metal is tantalum, and the second transition metal is ruthenium, wherein each of the layer of the second transition metal, the first layer of the nitride of the first transition metal, and the second layer of the nitride of the first transition metal is a single layer of a respective material, wherein the first layer of the nitride of the first transition metal directly contacts and extends along sidewalls of the first insulating layer and sidewalls of the etch stop layer, wherein the second layer of the nitride of the first transition metal directly contacts and extends along sidewalls of the conductive material, wherein the layer of the second transition metal directly contacts the first layer of the nitride of the first transition metal and the second layer of the nitride of the first transition metal, wherein the barrier layer directly contacts and extends along an upper portion of the sidewalls of the etch stop layer, wherein the conductive material directly contacts and extends along a lower portion of the sidewalls of the etch stop layer, wherein the conductive material directly contacts a bottom surface of the barrier layer facing the substrate.

8. The device of claim 7, wherein an upper surface of the first conductive feature distal from the substrate is free of the barrier layer.

9. The device of claim 7, wherein the bottom surface of the barrier layer is parallel to a top surface of the first conductive feature.

10. The device of claim 7, wherein the first layer of the nitride of the first transition metal and the second layer of the nitride of the first transition metal are thicker than the layer of the second transition metal.

11. The device of claim 10, wherein the first layer of the nitride of the first transition metal and the second layer of the nitride of the first transition metal have different thicknesses.

12. The device of claim 7, wherein the conductive material has a homogeneous composition.

13. The device of claim 12, wherein each of the layer of the second transition metal, the first layer of the nitride of the first transition metal, and the second layer of the nitride of the first transition metal has a respective homogeneous composition.

14. A device comprising:

a first conductive feature in a first dielectric layer;

an etch stop layer over the first conductive feature;

a second dielectric layer over the etch stop layer; and a second conductive feature in the second dielectric layer, the second conductive feature comprising:

a barrier layer comprising:

a first layer of a metal nitride, wherein the first layer of the metal nitride directly contacts and extends along sidewalls of the second dielectric layer and sidewalls of the etch stop layer;

a layer of a transition metal directly on the first layer of the metal nitride, wherein the transition metal is a different metal than a metal of the metal nitride; and a second layer of the metal nitride directly on the layer of the transition metal, wherein the layer of the transition metal is a single layer of ruthenium, the first layer of the metal nitride is a single layer of tantalum nitride, and the second layer of the metal nitride is another single layer of tantalum nitride; and a conductive filling material over the barrier layer, wherein the second layer of the metal nitride directly contacts and extends along sidewalls of the conductive filling material, wherein the conductive filling material extends through the etch stop layer and physically contacts a top surface of the first conductive feature, wherein the top surface of the first conductive feature is free of the metal nitride and the transition metal, wherein the barrier layer directly contacts and extends along an upper portion of the sidewalls of the etch stop layer, wherein the conductive filling material directly contacts and extends along a lower portion of the sidewalls of the etch stop layer, and directly contacts a bottom of the barrier layer facing the first conductive feature.

15. The device of claim 14, wherein the first layer of the metal nitride has a thickness in a range of 10 Å to 60 Å.

16. The device of claim 14, wherein a thickness of the layer of the transition metal is different from that of the first layer of the metal nitride and that of the second layer of the metal nitride.

17. The device of claim 16, wherein the layer of the transition metal is thinner than the first layer of the metal nitride and the second layer of the metal nitride.

18. The device of claim 16, wherein the first layer of the metal nitride has a different thickness than the second layer of the metal nitride.

* * * * *